United States Patent
Shyu

(10) Patent No.: US 7,611,066 B2
(45) Date of Patent: Nov. 3, 2009

(54) DIFFERENTIAL INPUT CIRCUIT WITH PROCESS VARIATION AND TEMPERATURE COMPENSATION

(75) Inventor: Jyn-Bang Shyu, Cupertino, CA (US)

(73) Assignee: Intelleflex Corporation, San Jose, CA (US)

( * ) Notice: Subject to any disclaimer, the term of this patent is extended or adjusted under 35 U.S.C. 154(b) by 611 days.

(21) Appl. No.: 11/143,019

(22) Filed: Jun. 1, 2005

(65) Prior Publication Data
US 2006/0273171 A1 Dec. 7, 2006

(51) Int. Cl.
G06K 19/06 (2006.01)
G08B 13/14 (2006.01)

(52) U.S. Cl. .................................... 235/492; 340/572.1
(58) Field of Classification Search ................. 235/492; 340/572.1–572.9, 10.1–10.6; 363/127
See application file for complete search history.

(56) References Cited

U.S. PATENT DOCUMENTS

| | | | | |
|---|---|---|---|---|
| 3,859,624 A * | 1/1975 | Kriofsky et al. | ............. | 340/941 |
| 6,252,457 B1 | 6/2001 | Umeyama et al. | ........... | 330/252 |
| 6,271,711 B1 | 8/2001 | Shenoy | ........................ | 327/530 |
| 6,275,110 B2 | 8/2001 | Kung | .......................... | 330/261 |
| 6,373,337 B1 | 4/2002 | Ganser | ....................... | 330/252 |
| 6,433,671 B1 | 8/2002 | Nysen | ...................... | 340/10.41 |
| 6,529,075 B2 | 3/2003 | Bruck et al. | ................. | 330/252 |
| 6,529,077 B1 | 3/2003 | Dasgupta | .................... | 330/254 |
| 6,531,957 B1 | 3/2003 | Nysen | ........................ | 340/10.1 |
| 6,563,726 B1 * | 5/2003 | Hirst | ........................... | 363/127 |
| 6,580,358 B1 | 6/2003 | Nysen | ...................... | 340/10.41 |
| 6,684,065 B2 | 1/2004 | Bult et al. | ................. | 455/252.1 |
| 6,750,715 B2 | 6/2004 | Allott et al. | .................. | 330/258 |
| 6,812,770 B2 | 11/2004 | Filoramo et al. | ............ | 327/359 |
| 6,859,190 B2 | 2/2005 | Pillai et al. | ................... | 343/860 |
| 2001/0041548 A1 | 11/2001 | Bult et al. | ................. | 455/252.1 |
| 2002/0149418 A1 | 10/2002 | Allott et al. | .................. | 327/560 |

OTHER PUBLICATIONS

International Search Report and Written Opinion from PCT Application No. PCT/US06/07963 mailed on Sep. 8, 2008.

* cited by examiner

Primary Examiner—Jamara A Franklin
(74) Attorney, Agent, or Firm—Zilka-Kotab, PC

(57) ABSTRACT

Systems with semiconductor devices that are DC-biased at either their weak inversion (i.e., sub-threshold) region or their strong inversion region. In a preferred embodiment using semiconductor devices (e.g., NMOS, PMOS, etc.), a gate to source voltage (Vgs) is slightly below the threshold voltage (Vtn) of the device. These weakly turned-on semiconductor devices increase the receiving AC sensitivity of an AM-Detector compared to that of a conventional AM-Detector without any DC-biasing. Further, the compensating bias voltage (Vbias) compensates for one or both of the ambient temperature change and the foundry's process variation of the various semiconductor devices.

32 Claims, 5 Drawing Sheets

DIFFERENTIAL INPUT CIRCUIT WITH PROCESS VARIATION AND TEMPERATURE COMPENSATION

FIELD OF THE INVENTION

The present invention relates to Radio Frequency (RF) signal processing circuitry, and more particularly, this invention relates to biased signal processing circuitry for RF tags and other RF devices.

BACKGROUND OF THE INVENTION

Automatic identification ("Auto-ID") technology is used to help machines identify objects and capture data automatically. One of the earliest Auto-ID technologies was the bar code, which uses an alternating series of thin and wide bands that can be digitally interpreted by an optical scanner. This technology gained widespread adoption and near-universal acceptance with the designation of the universal product code ("UPC")—a standard governed by an industry-wide consortium called the Uniform Code Council. Formally adopted in 1973, the UPC is one of the most ubiquitous symbols present on virtually all manufactured goods today and has allowed for enormous efficiency in the tracking of goods through the manufacturing, supply, and distribution of various goods.

However, the bar code still requires manual interrogation by a human operator to scan each tagged object individually with a scanner. This is a line-of-sight process that has inherent limitations in speed and reliability. In addition, the UPC bar codes only allow for manufacturer and product type information to be encoded into the barcode, not the unique item's serial number. The bar code on one milk carton is the same as every other, making it impossible to count objects or individually check expiration dates.

Currently cartons are marked with barcode labels. These printed labels have over 40 "standard" layouts, can be misprinted, smeared, mis-positioned and mis-labeled. In transit, these outer labels are often damaged or lost. Upon receipt, the pallets typically have to be broken-down and each case scanned into an enterprise system. Error rates at each point in the supply chain have been 4-18% thus creating a billion dollar inventory visibility problem. Only with radio frequency identification ("RFID") does the physical layer of actual goods automatically tie into software applications, to provide accurate tracking.

The emerging RFID technology employs a radio frequency ("RF") wireless link and ultra-small embedded computer chips, to overcome these barcode limitations. RFID technology allows physical objects to be identified and tracked via these wireless "tags". It functions like a bar code that communicates to the reader automatically without needing manual line-of-sight scanning or singulation of the objects. RFID promises to radically transform the retail, pharmaceutical, military, and transportation industries.

The advantages of RFIDs over bar code are summarized in Table 1:

TABLE 1

| Barcode | RFID |
| --- | --- |
| Need line-of-sight to read | Identification without visual contact |
| Read only | Able to read/write |
| Only a barcode number | Able to store information in tag |
| Barcode number is fixed | Information can be renewed anytime |
| Category level tagging only-no unique item identifier | Unique item identification |
| Unable to read if barcode is damaged | Can withstand harsh environment |
| Use once | Reusable |
| Low cost | Higher cost |
| Less Flexibility | Higher Flexibility/Value |

As shown in FIG. 1, an RFID system 100 includes a tag 102, a reader 104, and an optional server 106. The tag 102 includes an IC chip and an antenna. The IC chip includes a digital decoder needed to execute the computer commands that the tag 102 receives from the tag reader 104. The IC chip also includes a power supply circuit to extract and regulate power from the RF reader; a detector to decode signals from the reader; a backscatter modulator, a transmitter to send data back to the reader; anti-collision protocol circuits; and at least enough memory to store its EPC code.

Communication begins with a reader 104 sending out signals to find the tag 102. When the radio wave hits the tag 102 and the tag 102 recognizes and responds to the reader's signal, the reader 104 decodes the data programmed into the tag 102. The information is then passed to a server 106 for processing, storage, and/or propagation to another computing device. By tagging a variety of items, information about the nature and location of goods can be known instantly and automatically.

Many RFID systems use reflected or "backscattered" radio frequency (RF) waves to transmit information from the tag 102 to the reader 104. Since passive (Class-1 and Class-2) tags get all of their power from the reader signal, the tags are only powered when in the beam of the reader 104.

The Auto ID Center EPC-Compliant tag classes are set forth below:

Class-1

Identity tags (RF user programmable, maximum range 3 m)

Lowest cost

Class-2

Memory tags (8 bits to 128 Mbits programmable at maximum 3 m range)

Security & privacy protection

Low cost

Class-3

Battery tags (256 bits to 64 Kb)

Self-Powered Backscatter (internal clock, sensor interface support)

100 meter range

Moderate cost

Class-4

Active tags

Active transmission (permits tag-speaks-first operating modes)

30,000 meter range

Higher cost

In RFID systems where passive receivers (i.e., Class-1 and Class-2 tags) are able to capture enough energy from the transmitted RF to power the device, no batteries are necessary. In systems where distance prevents powering a device in this manner, an alternative power source must be used. For these "alternate" systems (also known as active or semi-passive), batteries are the most common form of power. This greatly increases read range, and the reliability of tag reads, because the tag doesn't need power from the reader. Class-3 tags only need a 10 mV signal from the reader in comparison to the 500 mV that a Class-1 tag needs to operate. This 2,500:1 reduction in power requirement permits Class-3 tags to operate out to a distance of 100 meters or more compared with a Class-1 range of only about 3 meters.

Early field trials have shown that the currently available passive short-range Class-1 and Class-2 tags are often inadequate for tagging pallets and many types of cases. The problems with these passive tags are particularly severe when working with "RF-unfriendly" materials like metal (like soup cans), metal foils (like potato chips), or conductive liquids (like soft drinks, shampoo). It is very difficult if not impossible to consistently read case tags located in the interior of a stack of cases, as occurs in a warehouse or pallet. The existing passive tags are also inadequate to tag large or rapidly moving objects like trucks, cars, shipping containers, etc. Class-3 tags solve this problem by incorporating batteries and signal preamplifiers to increase range.

Conventionally, RF AM-Detector design uses either Schottky diodes or MOS devices configured as a full-wave bridging rectifier structure to extract the base-band signal out of an incoming amplitude-modulated (AM) RF carrier. However, the wireless link distance is proportional to the receiving sensitivity of an AM-Detector. Thus, AM-Detector circuits implementing traditional diodes or transistors are not sensitive enough for long range use. To increase the receiving sensitivity of the RF AM-Detector, either low barrier Schottky diodes with zero-bias forward voltage or low-threshold MOS devices with zero-threshold voltage are preferred candidates to implement the AM demodulation function operating at very low input RF signal levels such as the signal power range from −20 dBm to −50 dBm or even lower. These AM-Detectors will work quite well under the low RF input power in that very little signal strength is required to turn on the zero-bias Schottky diodes or zero-threshold MOS devices.

FIG. 2A illustrates a prior art full wave bridging rectifier AM-Detector 200 using Schottky diodes D. The circuit 200 is coupled to opposite ends ANTIN+, ANTIN− of an antenna. A differential signal comes into the circuit 200 as a positive (+) and a negative (−) signal. When node N1 goes high, node N2 goes low. Conversely, when node N1 goes low, node N2 goes high. The signal from ANTIN+, for example, passes through an AC coupled capacitor C and to node N1. When the capacitor C goes high, node N1 will also go high. When node N1 goes high, the voltage exceeds the threshold voltage of diode D1 and passes through to node N3 and to the output of the rectifier 200. The signal also passes through the filtering elements $C_L$ and $R_L$ and to ground (Gnd). As shown, node N4 is also coupled to Gnd, so the signal that passed through node N3 passes through Gnd, and then through node N4. From node N4, it passes through diode D3 and out to the negative antenna input ANTIN− at node N2. Conceptually, the signal thus makes a loop through the circuit and antenna. The same thing happens in the reverse direction when the signal at node N1 goes low and the signal at node N2 goes high.

The output of the AM-Detector 200 is a rectified signal that is ready for processing by circuitry coupled to the output of the AM-Detector 200.

FIG. 2B illustrates a prior art full wave bridging rectifier AM-Detector 210 using NMOS devices M1-M4 that essentially function as diodes. The rectifier 210 of FIG. 2B functions in substantially the same way as the rectifier 200 in FIG. 2A.

FIG. 2C illustrates a prior art cross-connected NMOS full wave bridging rectifier AM-Detector 220 using NMOS devices M1-M4. The rectifier 220 of FIG. 2C functions similar to the rectifier 210 in FIG. 2B, with the additional benefits of increasing sensitivity provided by these cross-connected NMOS devices of M1 and M3.

However, both zero-bias Schottky diodes and zero-threshold MOS devices are sensitive to temperature, and are affected by process variations. More particularly, even with these feature-added devices, the conventional RF AM-Detector circuits suffer from the receiving sensitivity loss caused by ambient temperature changes and the foundry's inherent process variations. For instance, one degree Centigrade (C) temperature decrease will normally cause either the forward bias voltage of a Schottky diode or the threshold voltage of MOS devices to increase by about 2 mV. The forward bias voltage of a Schottky diode or the threshold voltage of a MOS device could potentially vary by more than 200 mV over a 100° C. temperature range, a large issue where the device is attempting to detect millivolt signals. This problem is an ongoing concern, as many commercial products are used in temperatures ranging, for example, from −5° C. to 70° C. in outdoor and refrigerated or heated environments; while industrial and military products cover even wider temperature ranges such as −40° C. to 85° C. and −55° C. to 125° C., respectively, in applications from cold storage to heated processing environments to high altitude and outer space applications.

SUMMARY OF THE INVENTION

The systems described herein solve the aforementioned problems even without the use of expensive Schottky diodes or zero-threshold MOS devices. Instead, the systems disclosed herein, which may be constructed with normal-threshold semiconductor devices such as MOS devices, are DC-biased at either their weak inversion (i.e., sub-threshold) region or their strong inversion region. In a preferred embodiment using NMOS devices which are DC-biased at their weak inversion region for saving the DC biasing current, a gate to source voltage (Vgs) is a few tens of millivolts (mV) below the threshold voltage (Vtn) of the device, which is normally about a few hundred mV. These weakly turned-on N-channel devices, for instance, increase the receiving AC sensitivity of an AM-Detector compared to that of a conventional AM-Detector using normal threshold NMOS devices without any DC-biasing. A constant current source is provided, preferably by using a current mirror technique. The compensating bias voltage (Vbias) generated by sourcing this constant current into a diode-connected device outside the circuit to be biased compensates for one or both of the ambient temperature change and the foundry's process variation of the various semiconductor devices.

Other aspects and advantages of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

BEST MODE FOR CARRYING OUT THE INVENTION

The following description is the best embodiment presently contemplated for carrying out the present invention. This description is made for the purpose of illustrating the general principles of the present invention and is not meant to limit the inventive concepts claimed herein.

Figure 2A:
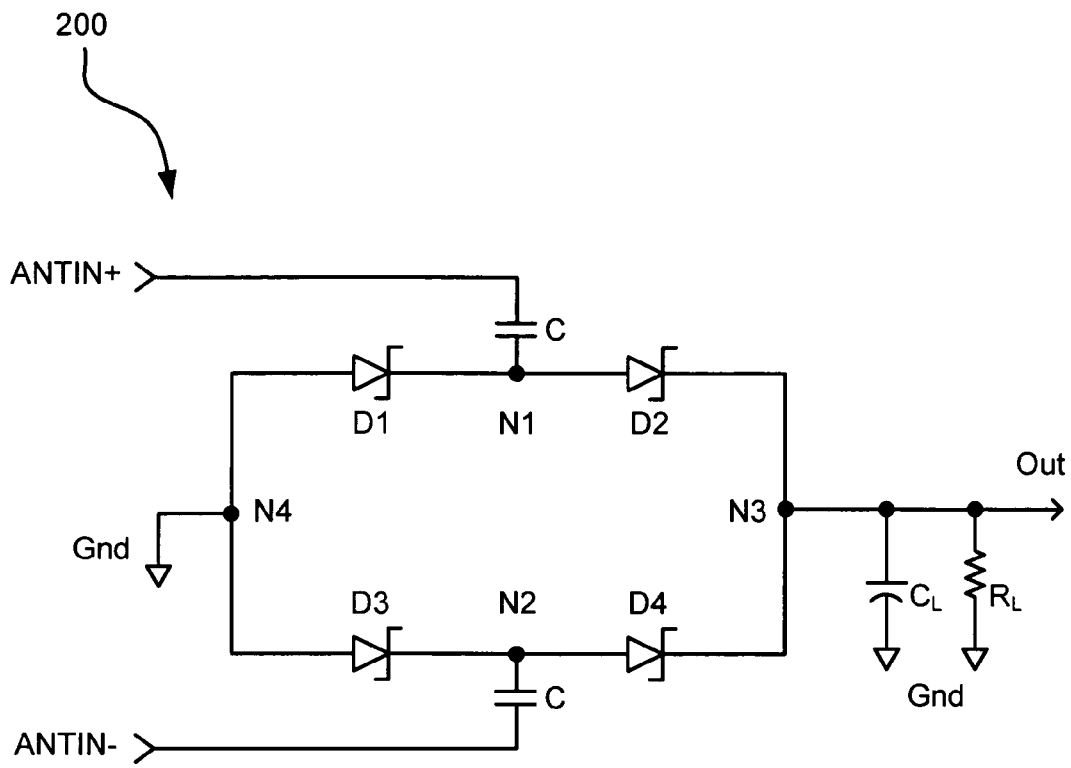
FIG. 2A is a circuit diagram of a full wave bridging rectifier AM-Detector using Schottky diodes.
Figure 2B:
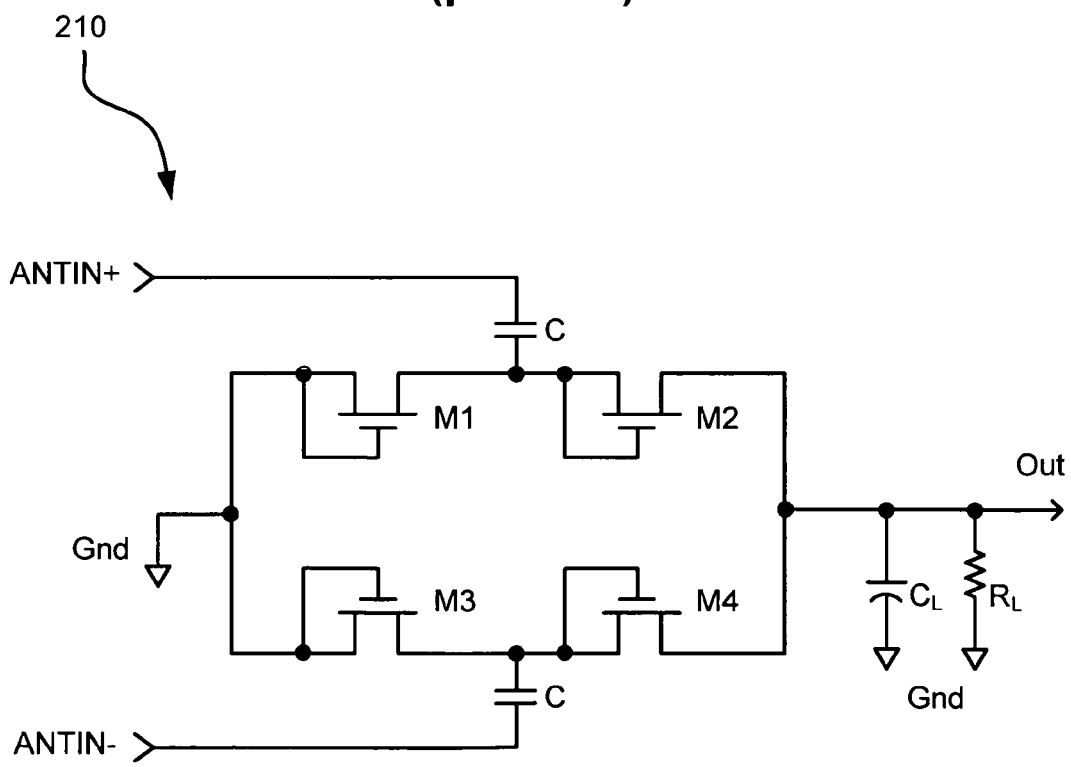
FIG. 2B is a circuit diagram of a full wave bridging rectifier AM-Detector using NMOS devices.
Figure 2C:
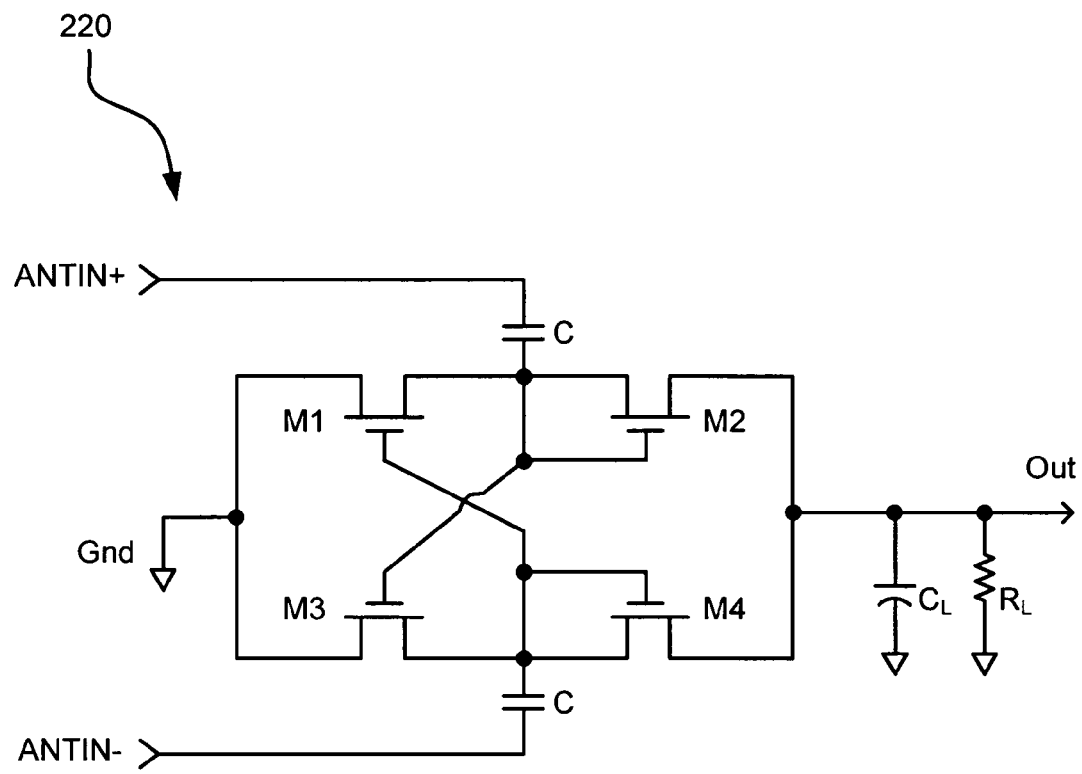
FIG. 2C is a circuit diagram of a cross-connected full wave bridging rectifier AM-Detector using NMOS devices.

The following specification describes systems capable of using normal threshold N-Channel MOS (NMOS) and other types of semiconductor devices which are DC-biased at their inversion region. The "inversion region" collectively refers to a point in the weak inversion (i.e., sub-threshold) region and the strong inversion region (at threshold and above) of the semiconductor device. In an AM detection application, these either weakly or strongly turned-on semiconductor devices will increase the receiving AC sensitivity of an AM-Detector as compared to that of a conventional AM-Detector (FIGS. 2A-C) using normal threshold NMOS devices without any DC-biasing. The disclosed circuits are also useful in charge pumps for traditional voltage multiplications.

Figure 1:
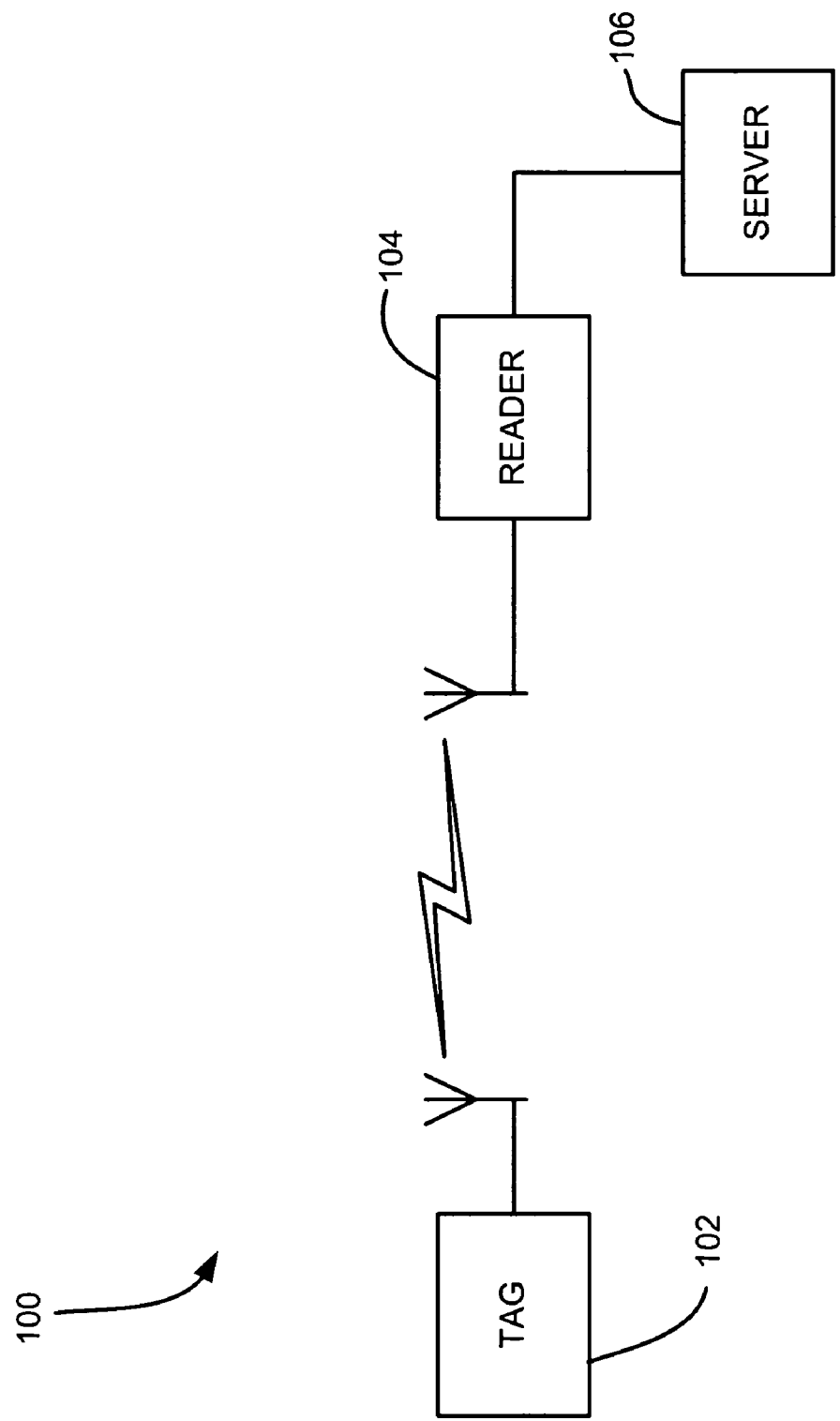
FIG. 1 is a system diagram of an RFID system.

Many types of devices can take advantage of the embodiments disclosed herein, including but not limited to Radio Frequency Identification (RFID) systems (all Classes) and other wireless devices/systems; pacemakers; portable electronic devices; audio devices and other electronic devices; smoke detectors; etc. To provide a context, and to aid in understanding the embodiments of the invention, much of the present description shall be presented in terms of an RFID system such as that shown in FIG. 1. It should be kept in mind that this is done by way of example only, and the invention is not to be limited to RFID systems, as one skilled in the art will appreciate how to implement the teachings herein into electronics devices in hardware and/or software. Examples of hardware include Application Specific Integrated Circuits (ASICs), printed circuits, monolithic circuits, reconfigurable hardware such as Field Programmable Gate Arrays (FPGAs), etc.

Figure 3:
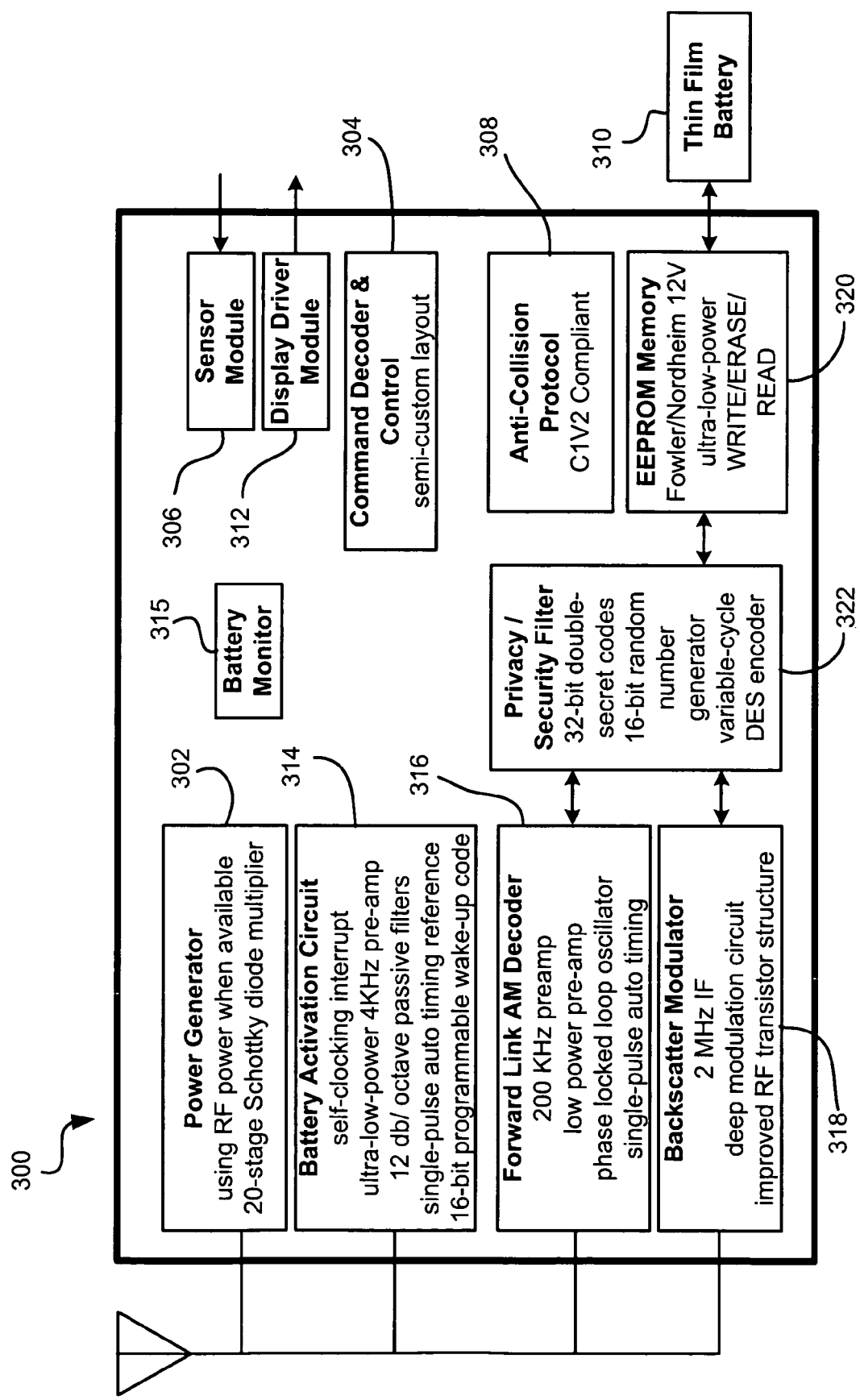
FIG. 3 is a system diagram for an integrated circuit (IC) chip for implementation in an RFID tag.

Embodiments of the present invention are preferably implemented in a Class-3 or higher Class chip. FIG. 3 depicts a circuit layout of a Class-3 chip 300 according to an illustrative embodiment for implementation in an RFID tag. This Class-3 chip can form the core of RFID chips appropriate for many applications such as identification of pallets, cartons, containers, vehicles, or anything where a range of more than 2-3 meters is desired. As shown, the chip 300 includes several industry-standard circuits including a power generation and regulation circuit 302, a digital command decoder and control circuit 304, a sensor interface module 306, a C1V2 interface protocol circuit 308, and a power source (battery) 310. A display driver module 312 can be added to drive a display.

A battery activation circuit 314 is also present to act as a wake-up trigger. This circuit 314 is described in detail below. In brief, the battery activation circuit 314 includes an ultra-low-power, narrow-bandwidth preamplifier with a static current drain of only 50 nA. The battery activation circuit 314 also includes a self-clocking interrupt circuit and uses an innovative 16-bit user-programmable digital wake-up code. The battery activation circuit 314 draws less power during its sleeping state and is much better protected against both accidental and malicious false wake-up trigger events that otherwise would lead to pre-mature exhaustion of the Class-3 tag battery 310.

A battery monitor 315 monitors power usage in the device. The information collected can then be used to estimate a useful remaining life of the battery.

A forward link AM decoder 316 uses a simplified phase-lock-loop oscillator that requires an absolute minimum amount of chip area. Preferably, the circuit 316 requires only a minimum string of reference pulses.

A backscatter modulator block 318 preferably increases the backscatter modulation depth to more than 50%.

A pure, Fowler-Nordheim direct-tunneling-through-oxide mechanism 320 is present to reduce both the WRITE and ERASE currents to less than 0.1 μA/cell in the EEPROM memory array. Unlike any RFID tags built to date, this will permit designing of tags to operate at maximum range even when WRITE and ERASE operations are being performed.

The module 300 may also incorporate a highly-simplified, yet very effective, security encryption circuit 322.

Only four connection pads (not shown) are required for the chip 200 to function: Vdd to the battery, ground, plus two antenna leads to support multi-element omni-directional antennas. Sensors to monitor temperature, shock, tampering, etc. can be added by appending an industry-standard I2C interface to the core chip.

Extremely low-cost Class-2 security devices can be built by simply disabling or removing the wake-up module, pre-amplifiers, and/and IF modules from the Class-3 chip core.

Figure 4:
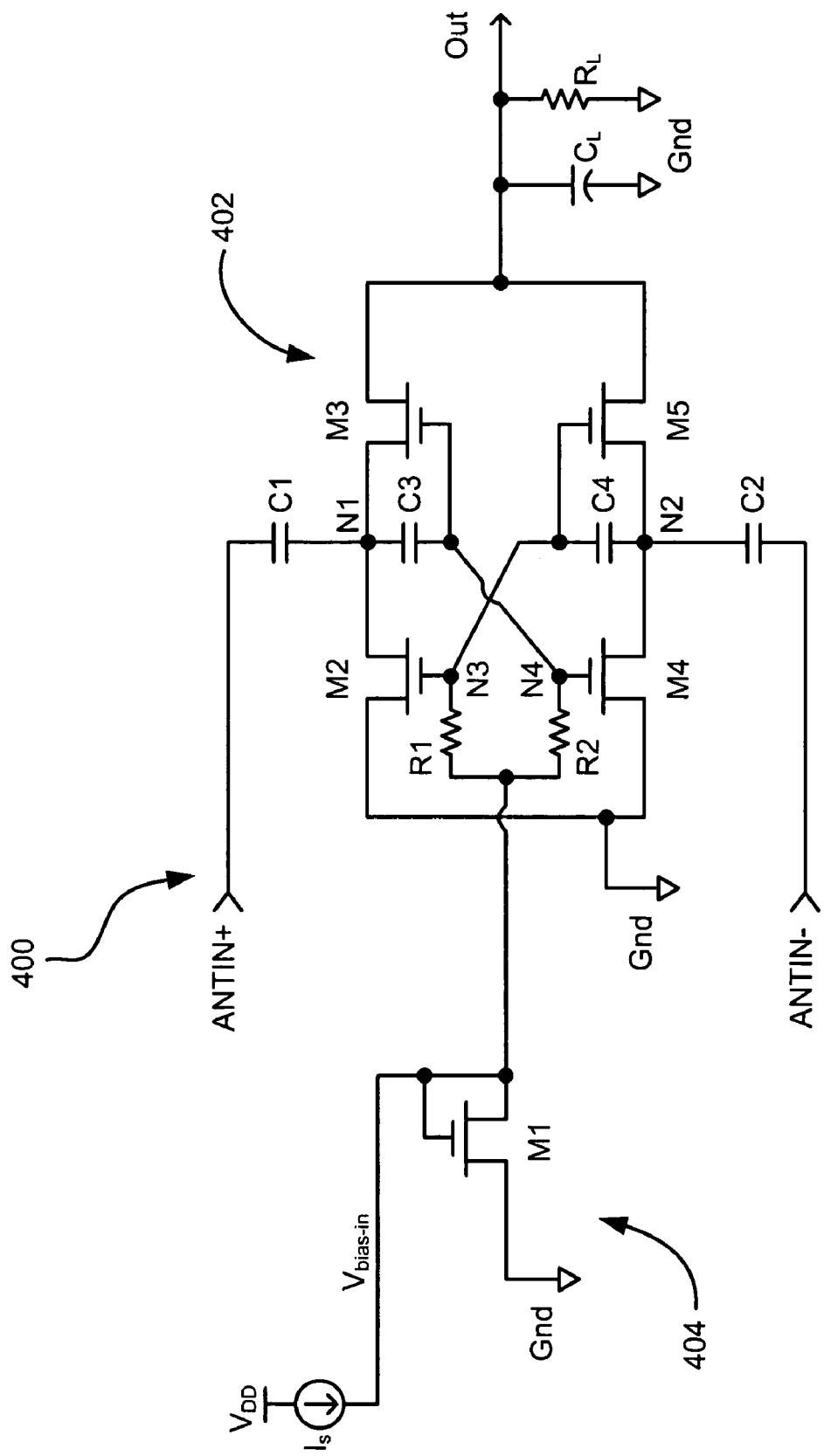
FIG. 4 is a circuit diagram of a DC-biased, cross-connected full wave bridging rectifier AM-Detector using NMOS devices according to one embodiment.

FIG. 4 illustrates a DC-biased cross-connected NMOS full wave bridging rectifier AM detector circuit 400 according to a preferred embodiment. The circuit 400 can form part of the forward link AM decoder 316 of FIG. 3 or other type of RF device. One skilled in the art will also appreciate that other types of circuits can take advantage of the teachings herein, and that the embodiment shown in FIG. 4 is presented by way of example only.

With continued reference to FIG. 4, the circuit 400 includes two antenna inputs ANTIN+, ANTIN− that are coupled to an antenna of a host device, such as an RFID tag. Signals generated on the antenna are presented to the circuit via the antenna inputs ANTIN+, ANTIN−. Capacitors C1, C2 are also present on the antenna inputs.

The circuit 400 further includes semiconductor devices M1, M2, M3, M4, M5. In the embodiment shown, the semiconductor devices M1-M5 are N-Channel MOS (NMOS) devices. Note that though shown in the illustrated embodiment, these biasing and bridging MOS M1-M5 devices do not have to be implemented as N-channel MOS devices shown in FIG. 4. Rather, the circuit 400 and its variants can work as well by changing these devices with P-channel MOS devices or with many other types of semiconductor devices including but not limited to MESFET, BJT, JFET, etc.

The semiconductor devices M1-M5 can advantageously be normal-threshold semiconductor devices, of the type commonly found in low cost circuitry. Such normal-threshold devices typically have a threshold voltage (Vtn) of about a few hundred mV. An advantage of the present invention is that these devices are very inexpensive to fabricate.

The embodiments described herein will also work with specialty devices, including low and "zero" threshold transistors having a threshold voltage of less than about 250 mV.

The semiconductor devices M2-M5 in the rectifier portion 402 are DC-biased at their inversion region by a biasing circuit 404 that includes semiconductor device M1. In a weak inversion example, the biasing circuit 404 can provide a bias voltage such that a gate to source voltage (Vgs) is about a few tens of mV below the threshold voltage (Vtn), where the threshold voltage in the case of N-channel devices is normally about a few hundred mV, and typically greater than about 250 mV. Because these N-channel devices are weakly turned-on, the receiving AC sensitivity of the AM-Detector 400 is greatly increased compared to that of a conventional AM-Detector using normal threshold NMOS devices without any DC-biasing. In other words, since devices M2-M5 are slightly on, very slight variations in the incoming antenna signals will cause the devices to switch immediately, as opposed to having to wait until the signal is large enough to cause switching.

A reason for biasing devices M2-M5 into their sub-threshold region is to minimize power consumption, as loss across device M1 is minimal at voltages between the threshold and the cutoff or "leakage" point of device M1. Accordingly, a constant biasing current of about 20 nA works well for NMOS devices. Of course one skilled in the art will appreciate that other biasing currents can be used, and selection of a desired current level may depend on the type of semiconductor devices implemented for devices M1-M5, level of sensitivity desired, power available on the host device, etc. An illustrative current range is between about 1 pA and about 1 uA.

Improved detector performance will also be obtained from biasing in the strong inversion region. For NMOS devices biased at their strong threshold regions, a constant biasing current of about 20 μA works well. Again, one skilled in the art will appreciate that other biasing currents can be used, and selection of a desired current level may depend on the type of semiconductor devices implemented for devices M1-M5, level of sensitivity desired, power available on the host device, etc. An illustrative current range is between about 1 μA and about 1 mA.

The biasing circuit 404 provides a constant current source by preferably using a current mirror technique with device M1. The compensating bias voltage (Vbias) as applied to the devices M2-M5 is generated by sourcing a constant current from an on-chip current generator or external power source and into a diode-connected NMOS device M1, thereby compensating for both the ambient temperature change and the foundry's process variation of the semiconductor devices M2-M5 in the rectifier portion 402. This is because device M1, which controls the bias voltage level, has substantially the same construction and/or properties as devices M2-M5, and preferably is substantially identical to devices M2-M5. Ideally, device M1 is formed concurrently with devices M2-M5. As known to those skilled in the art, it is not uncommon for the threshold voltage of manufactured transistors to vary by 100 mV from lot to lot. But similar transistors in a common part of the wafer typically vary by no more than about 1 mV. By concurrently forming devices M1-M5, the accuracy of compensation can be improved by about 100:1.

Device M1 is configured to function as a bias diode using the current mirror technique. The mirror is initially zero. When enough current builds up on the gate, device M1 opens and the current flows through device M1 to ground (Gnd). If the voltage goes down, the gate on device M1 closes. Thus, the mirror self-settles to the threshold of device M1. And because M1 is constructed to have the same or very similar characteristics as devices M2-M5, the bias voltage (Vbias) is adjusted as the threshold of device M1 is changed by temperature variations. Also, since devices M1-M5 are created together, any processing variations in the devices are built in to device M1. Thus, the voltage node formed by device M1 provides just enough power to keep devices M2-M5 at the proper operating point.

Resistors R1, R2 prevent the AC signal at nodes N3 and N4 from passing into the back end of the biasing circuit 404. Similarly, capacitors C3 and C4 allow the AC to pass to nodes N3 and N4, but prevent the DC from passing to nodes N1 and N2, thereby isolating the DC. When the AC signal goes high, the AC couples and the gate opens. The AC looks the same as it would without the biasing circuit. But now the transistors of M2-M5 function similar to zero threshold transistors.

Another advantage of using a MOS device vs. a diode is that the bias circuit 404 uses very low power, as the current is not injected through the antenna signal path. Rather, the bias voltage (Vbias) is applied to the gates of devices M2-M5, and so is isolated in the bias circuit (except for the ground through device M1). In fact the higher the resistance of resistors R1 and R2, the better. Their size has no long term effect on the bias voltage (Vbias). The current associated with Vbias can be very small, such as less than about 100 nanoAmperes (nA). One illustrative current is about 20 nA.

In one example, to compensate for process variation, the M1 device for the slow process corner of the wafer may have a roughly 100 mV higher threshold voltage (Vtn) than that of the normal process corner. Therefore, it will self-adjust to allow a higher Vbias to be applied to the full wave bridging rectifier devices M2-M5. In contrast, the M1 device for the fast process corner of the wafer may have a roughly 100 mV lower Vtn than that of the normal process corner. Therefore, it will self-adjust the Vbias to these devices M2-M5 to a lower level.

To compensate for ambient temperature change, if the ambient temperature decreases, the threshold voltage of device M1 will increase, resulting in a higher Vbias being applied to devices M2-M5. If the ambient temperature increases, the threshold voltage of device M1 will decrease so that devices M2-M5 will be turned on with a lower Vbias.

This design works best for low voltage applications, preferably below 500 mV. The transistors would function differently at higher voltages, changing the way the circuit detects incoming signals and resulting in variable gain. For instance, at higher voltage levels, the body effect of Vtn of transistors M2-M5 comes into play. A higher voltage on the output load, for example, would increase the required voltages on the gates of devices M2 and M5 to cause switching. The embodiments described herein have a higher gain and thus more sensitivity at lower signal strength, while gain is reduced at higher signal strength. Thus, the embodiments described herein are particularly well suited to RF detection and other low power applications. Further, behind the circuit 400 shown in FIG. 4 is a preamplifier, a lower output voltage is desirable when the input signal power is very large such as input voltage is above 500 mV.

Accordingly, the receiving sensitivity loss due to one or both of temperature change and process variation is properly compensated for by the embodiments of the invention disclosed herein. As a result, a better receiving sensitivity of a RF AM-Detector over a wide range of temperature and processing variations can be achieved. By following the teachings herein, one practicing the invention can achieve better yields, higher performance and lower production costs as well.

Again, it should be stressed that the teachings herein can be applied to other types of circuits, including those having more or fewer components, different functionality, While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A differential input circuit, comprising:
   a first set of semiconductor devices coupled to a first alternating current (AC) signal input;
   a second set of semiconductor devices coupled to a second AC signal input; and
   a biasing circuit providing a direct current (DC) bias voltage to gates of the semiconductor devices.

2. A circuit as recited in claim 1, wherein the semiconductor devices are selected from a group consisting of NMOS, PMOS, MOSFET, MESFET, BJT, and JFET devices.

3. A circuit as recited in claim 1, wherein the first and second sets of semiconductor devices form at least part of a differential input full wave bridging rectifier radio frequency (RF) amplitude modulation (AM) detector.

4. A circuit as recited in claim 3, wherein the semiconductor devices in each set are cross connected.

5. A circuit as recited in claim 1, wherein the biasing circuit includes a semiconductor device that has substantially the same temperature response as the semiconductor devices in the sets of semiconductor devices.

6. A circuit as recited in claim 1, wherein the biasing circuit includes a semiconductor device that has substantially the same construction as the semiconductor devices in the sets of semiconductor devices.

7. A circuit as recited in claim 1, wherein the biasing voltage biases the semiconductor devices at inversion regions of the semiconductor devices.

8. A circuit as recited in claim 1, wherein each of the semiconductor devices has a switching threshold, wherein the bias voltage urges each of the semiconductor device towards a sub-threshold region thereof.

9. A circuit as recited in claim 1, wherein the biasing circuit includes a current mirror.

10. A circuit as recited in claim 1, further comprising at least one resistor for isolating the biasing circuit from the AC signal inputs.

11. A circuit as recited in claim 1, further comprising a capacitor coupled to each of the AC signal inputs for isolating the AC signal inputs from the biasing circuit.

12. A circuit as recited in claim 1, wherein the semiconductor devices have a threshold voltage of at least about 250 millivolts.

13. A circuit as recited in claim 1, wherein a sensitivity of the circuit decreases as signal levels from the AC signal inputs increase above a threshold voltage of the semiconductor devices.

14. A Radio Frequency Identification (RFID) system, comprising:
   a plurality of RFID tags each having the circuit of claim 1; and
   an RFID interrogator in communication with the RFID tags.

15. A differential input radio frequency amplitude modulation detector circuit, comprising;
   a first set of semiconductor devices coupled to a first alternating current (AC) signal input;
   a second set of semiconductor devices coupled to a second AC signal input;
   an output coupled to the sets of semiconductor devices; and
   a biasing circuit providing a direct current (DC) bias voltage to the semiconductor devices,
   wherein the semiconductor devices function substantially as zero voltage bias threshold device under the influence of the bias voltage.

16. A circuit as recited in claim 15, wherein the semiconductor devices are selected from a group consisting of NMOS, PMOS, MOSFET, MESFET, BJT, and JFET devices.

17. A circuit as recited in claim 15, wherein the circuit is a differential input full wave bridging rectifier radio frequency (RF) amplitude modulation (AM) detector.

18. A circuit as recited in claim 15, wherein the circuit is a cross-connected full wave bridging rectifier radio frequency (RF) amplitude modulation (AM) detector.

19. A circuit as recited in claim 15, wherein the biasing circuit includes a semiconductor device that has substantially the same temperature response as the semiconductor devices in the sets of semiconductor devices.

20. A circuit as recited in claim 15, wherein the biasing circuit includes a semiconductor device that has substantially the same construction as the semiconductor devices in the sets of semiconductor devices.

21. A circuit as recited in claim 15, wherein the biasing voltage biases the semiconductor devices at inversion regions of the semiconductor devices.

22. A circuit as recited in claim 15, wherein each of the semiconductor devices has a switching threshold, wherein the bias voltage urges each of the semiconductor devices towards a sub-threshold region thereof.

23. A circuit as recited in claim 15, wherein each of the semiconductor devices has a threshold voltage, wherein the bias voltage is less than about 100 mV below the threshold voltage.

24. A circuit as recited in claim 15, wherein the biasing circuit includes a current mirror.

25. A circuit as recited in claim 15, further comprising at least one resistor for isolating the biasing circuit from the AC signal inputs.

26. A circuit as recited in claim 15, further comprising a capacitor coupled to each of the AC signal inputs for isolating the AC signal inputs from the biasing circuit.

27. A circuit as recited in claim 15, wherein the semiconductor devices have a threshold voltage of at least about 250 millivolts.

28. A circuit as recited in claim 15, wherein a sensitivity of the circuit decreases as signal levels from the AC signal inputs increase above a threshold voltage of the semiconductor devices.

29. A Radio Frequency Identification (RFID) system, comprising:
   a plurality of RFID tags each having the circuit of claim 15; and
   an RFID interrogator in communication with the RFID tags.

30. A circuit, comprising:
   a set of semiconductor devices coupled to an alternating current (AC) signal input;
   a biasing circuit providing a direct current (DC) bias voltage to gates of the semiconductor devices,
   wherein the biasing circuit includes a first device having substantially the same construction as the semiconductor devices, the first device regulating the bias voltage at a level sufficient to bias the semiconductor devices at inversion regions thereof.

31. A circuit as recited in claim 30, wherein the biasing circuit compensates for variations in fabrication parameters of the semiconductor devices, wherein the biasing circuit also compensates for temperature variations affecting the semiconductor devices.

32. A Radio Frequency Identification (RFID) system, comprising:
  a plurality of RFID tags each having the circuit of claim 30; and
  an RFID interrogator in communication with the RFID tags.

* * * * *

UNITED STATES PATENT AND TRADEMARK OFFICE
CERTIFICATE OF CORRECTION

| | |
|---|---|
| PATENT NO. | : 7,611,066 B2 |
| APPLICATION NO. | : 11/143019 |
| DATED | : November 3, 2009 |
| INVENTOR(S) | : Jyn-Bang Shyu |

Page 1 of 1

It is certified that error appears in the above-identified patent and that said Letters Patent is hereby corrected as shown below:

In the claims:
col. 9 line 60 change "comprising;" to --comprising:--.

Signed and Sealed this

Twelfth Day of January, 2010

David J. Kappos
*Director of the United States Patent and Trademark Office*